United States Patent
Yamamoto et al.

(10) Patent No.: US 8,133,663 B2
(45) Date of Patent: Mar. 13, 2012

(54) PATTERN FORMING METHOD AND APPARATUS

(75) Inventors: Taro Yamamoto, Koshi (JP); Hitoshi Kosugi, Koshi (JP); Yoshiaki Yamada, Minato-ku (JP); Yasuhito Saiga, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 850 days.

(21) Appl. No.: 11/782,233

(22) Filed: Jul. 24, 2007

(65) Prior Publication Data

US 2008/0038671 A1 Feb. 14, 2008

(30) Foreign Application Priority Data

Aug. 8, 2006 (JP) .................. 2006-216009

(51) Int. Cl.
*G03F 7/26* (2006.01)
(52) U.S. Cl. ........................ 430/322
(58) Field of Classification Search .................. 430/322, 430/325, 328
See application file for complete search history.

(56) References Cited

U.S. PATENT DOCUMENTS

| | | | |
|---|---|---|---|
| 4,007,047 A * | 2/1977 | Kaplan et al. | 430/324 |
| 5,874,200 A * | 2/1999 | Ra et al. | 430/313 |
| 2002/0110760 A1* | 8/2002 | Lin | 430/322 |
| 2002/0189640 A1* | 12/2002 | Linn et al. | 134/3 |
| 2005/0042554 A1* | 2/2005 | Dierichs et al. | 430/322 |
| 2005/0073670 A1* | 4/2005 | Carroll | 355/77 |
| 2005/0109992 A1* | 5/2005 | Lee et al. | 252/510 |
| 2005/0130079 A1* | 6/2005 | Endo et al. | 430/327 |

FOREIGN PATENT DOCUMENTS

| | | |
|---|---|---|
| JP | 09-106081 | 4/1997 |
| JP | 2000-306795 | 11/2000 |
| JP | 2001-290287 | 10/2001 |
| JP | 2002-246290 | 8/2002 |
| JP | 2003-255557 | 9/2003 |
| JP | 2004-146478 | 5/2004 |
| JP | 2005-109146 | 4/2005 |
| JP | 2005-157259 | 6/2005 |

(Continued)

OTHER PUBLICATIONS

Japanese Office Action issued in Japanese Patent Application No. 2006-216009 mailed on Jan. 25, 2011 (with partial English translation).

(Continued)

*Primary Examiner* — Kathleen Duda
*Assistant Examiner* — Brittany Raymond
(74) *Attorney, Agent, or Firm* — Oblon, Spivak, McClelland, Maier & Neustadt, L.L.P.

(57) ABSTRACT

A pattern forming method includes forming a resist film or sequentially forming a resist film and a protection film in this order on a surface of a substrate; then, performing immersion light exposure that includes immersing the resist film or the resist film and the protection film formed on the substrate in a liquid during light exposure, thereby forming a predetermined light exposure pattern on the resist film; and performing a development process of the light exposure pattern by use of a development liquid, thereby forming a predetermined resist pattern. After the immersion light exposure and before the development process, the method further includes performing a hydrophilic process of turning a surface of the resist film or the protection film serving as a substrate surface into a hydrophilic state to allow the substrate surface to be wetted with the development liquid overall.

13 Claims, 14 Drawing Sheets

FOREIGN PATENT DOCUMENTS

| | | |
|---|---|---|
| JP | 2005-183438 | 7/2005 |
| JP | 2005-250084 | 9/2005 |
| JP | 3719843 | 9/2005 |
| JP | 2005-322796 | 11/2005 |
| JP | 2006-119292 | 5/2006 |
| WO | WO99/49504 | 9/1999 |

OTHER PUBLICATIONS

Office Action issued Aug. 10, 2011, in Japanese Patent Application No. 2006-216009, filed Aug. 8, 2006 (with partial English translation).

* cited by examiner

PATTERN FORMING METHOD AND APPARATUS

BACKGROUND OF THE INVENTION

1. Field of the Invention

The present invention relates to a pattern forming method and pattern forming apparatus for forming a predetermined resist pattern in, e.g., manufacturing semiconductor devices, wherein light exposure is performed on a resist film in accordance with a predetermined pattern by immersion light exposure, and then development of a light exposure pattern is performed.

2. Description of the Related Art

In a photolithography step for semiconductor devices, resist is applied onto a semiconductor wafer (which will be simply referred to as "wafer") to form a resist film, which is subsequently subjected to light exposure in accordance with a predetermined circuit pattern, and a development process to form a circuit pattern on the resist film.

According to the most advanced photolithography step of this kind, it is possible to form a minute circuit pattern with a line width of about 90 nm (a 90-nm node level).

In recent years, circuit patterns of semiconductor devices have been increasingly smaller, and technical development is further proceeding from the 90-nm node level toward a 45-nm node level. Along with this trend, it is required to improve characteristics of light exposure concerning the resolution performance. Accordingly, a light exposure technique using extreme ultraviolet light (EUVL: Extreme Ultra Violet Lithography), a light exposure technique using dimeric fluorine ($F_2$), and so forth have been developed. Further, for example, on the basis of an improvement to enhance the resolution performance in a light exposure technique using argon fluoride (ArF) or krypton fluoride (KrF), there has been proposed a method for performing light exposure while providing a liquid layer consisting of light-transmitting liquid on the surface of a substrate (which will be referred to as "immersion light exposure"), (for example, see International Publication No. WO 99/49504).

Further, as regards the immersion light exposure, in order to prevent the light-transmitting liquid (which will be referred to as "immersion liquid") from coming into direct contact with the resist film during light exposure, there has been proposed a method for performing immersion light exposure from above a protection film (which will be referred to as "top coating"), which is formed on the resist film in advance (see Jpn. Pat. Appln. KOKAI Publication No. 2005-157259).

On the other hand, in order to omit the step of forming the protection film, there has been studied a method for performing immersion light exposure directly on the surface of the resist film without using the top coating, i.e., in a top coating-less manner.

In any of the methods described above, the surface of the top coating or resist film needs to be hydrophobic, so that a sufficient liquid resistance is ensured against the immersion liquid during the light exposure, and the immersion head of the light exposure unit can be moved at a sufficient scanning speed.

Where a development process is performed on a wafer having a top coating or resist film formed thereon with a hydrophobic surface, the wafer surface repels the development liquid applied thereon, and thereby hinders the development liquid from being filled on the wafer. In this case, it is difficult to perform development uniformly and reliably on the wafer, resulting in fluctuations in CD (Critical Dimension) and faults of the development process, such as generation of defects. Consequently, a problem arises such that a predetermined resist pattern cannot be uniformly and reliably formed.

BRIEF SUMMARY OF THE INVENTION

An object of the present invention is to provide a pattern forming method and pattern forming apparatus that allow a predetermined resist pattern to be uniformly and reliably formed on a substrate even where the substrate has a hydrophobic surface for immersion light exposure. Another object of the present invention is to provide a computer readable storage medium that stores a control program for executing the pattern forming method.

According to a first aspect of the present invention, there is provided a pattern forming method comprising: pattern forming method comprising: forming a resist film or sequentially forming a resist film and a protection film in this order on a surface of a substrate; then, performing immersion light exposure that includes immersing the resist film or the resist film and the protection film formed on the substrate in a liquid during light exposure, thereby forming a predetermined light exposure pattern on the resist film; performing a development process of the light exposure pattern by use of a development liquid, thereby forming a predetermined resist pattern; and performing a hydrophilic process of turning a surface of the resist film or the protection film serving as a substrate surface into a hydrophilic state to allow the substrate surface to be wetted with the development liquid overall, after the immersion light exposure and before the development process.

In the first aspect, the hydrophilic process may include supplying a chemical solution onto the surface of the resist film or the protection film, or include radiating ultraviolet rays onto the surface of the resist film or the protection film. The chemical solution may be used to perform cleaning of the substrate surface in addition to the hydrophilic process. The method may further comprise performing a cleaning process in one or both of periods before and after the hydrophilic process using the chemical solution. The method may further comprise radiating ultraviolet rays onto the surface of the resist film or the protection film before or after the hydrophilic process using the chemical solution. The method may comprise sequentially performing a cleaning process using a cleaning liquid and the hydrophilic process using the chemical solution in this order after performing the ultraviolet irradiation. The method may comprise sequentially performing a cleaning process using a cleaning liquid, the hydrophilic process using the chemical solution, the ultraviolet irradiation, and a cleaning process using a cleaning liquid, in this order.

The method may comprise performing the hydrophilic process using the chemical solution before performing a heating process to promote an acid catalyst reaction for the resist film prior to the development process. The chemical solution preferably comprises an acid solution, and more preferably comprises a dilute acid. Specifically, the dilute acid may be selected from the group consisting of acetic acid, formic acid, hydrochloric acid, sulfuric acid, and perfluoroalkylsulfonic acid.

According to a second aspect of the present invention, there is provided a pattern forming apparatus comprising: a coating section configured to form a resist film or sequentially forming a resist film and a protection film in this order on a surface of a substrate; an immersion light exposure section configured to immerse the resist film or the resist film and the protection film formed on the substrate in a liquid during light exposure, so as to form a predetermined light exposure pattern on the resist film; a development section configured to perform a development process of the light exposure pattern by use of a development liquid, thereby forming a predetermined resist pattern; and a hydrophilic mechanism configured to perform a hydrophilic process of turning a surface of the resist film or the protection film serving as a substrate surface into a hydrophilic state to allow the substrate surface to be wetted with the development liquid overall, after the light exposure by the immersion light exposure section and the development process by the development section.

In the second aspect, the hydrophilic mechanism may include a chemical solution supply mechanism configured to supply onto the substrate surface a chemical solution for turning the surface of the resist film or the protection film into a hydrophilic state, or include an ultraviolet irradiation mechanism configured to irradiate the substrate surface with ultraviolet rays for turning the surface of the resist film or the protection film into a hydrophilic state. The hydrophilic mechanism may include both of the chemical solution supply mechanism and the ultraviolet irradiation mechanism.

The apparatus may further comprise a cleaning section configured to perform cleaning while supplying a cleaning liquid onto the substrate after the light exposure. The hydrophilic mechanism may be disposed in the cleaning section. The apparatus may further comprise a heating section configured to heat the substrate to promote an acid catalyst reaction for the resist film, wherein the hydrophilic process may be performed by the hydrophilic mechanism before a heating process is performed by the heating section prior to the development process in the development section.

According to a third aspect of the present invention, there is provided a computer readable storage medium that stores a control program for execution on a computer, the control program, when executed, causing the computer to control a pattern forming apparatus to conduct the method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
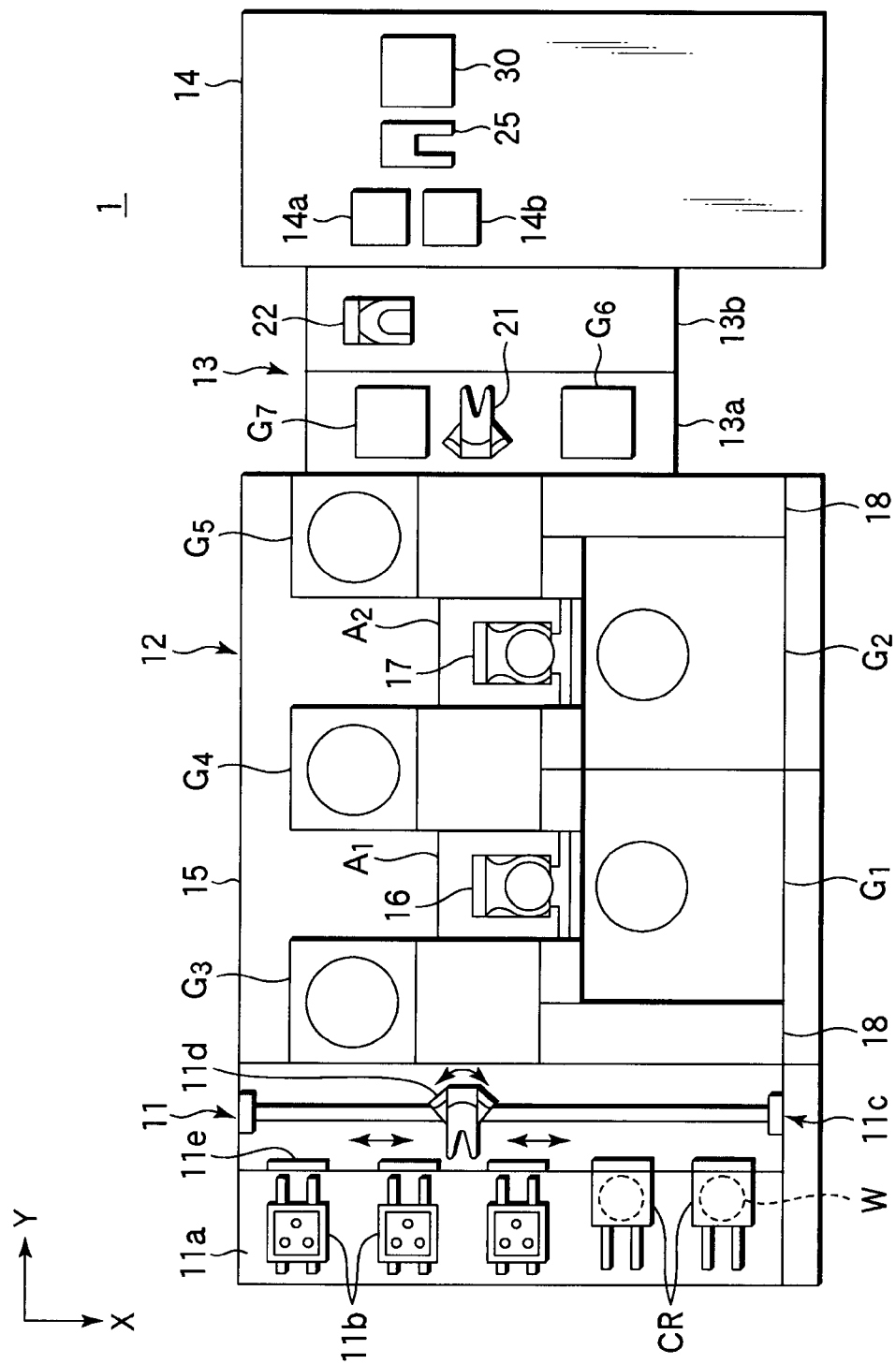
FIG. 1 is a plan view schematically showing the layout of a pattern forming apparatus including a post-cleaning unit (POCLN) for processing semiconductor wafers, according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
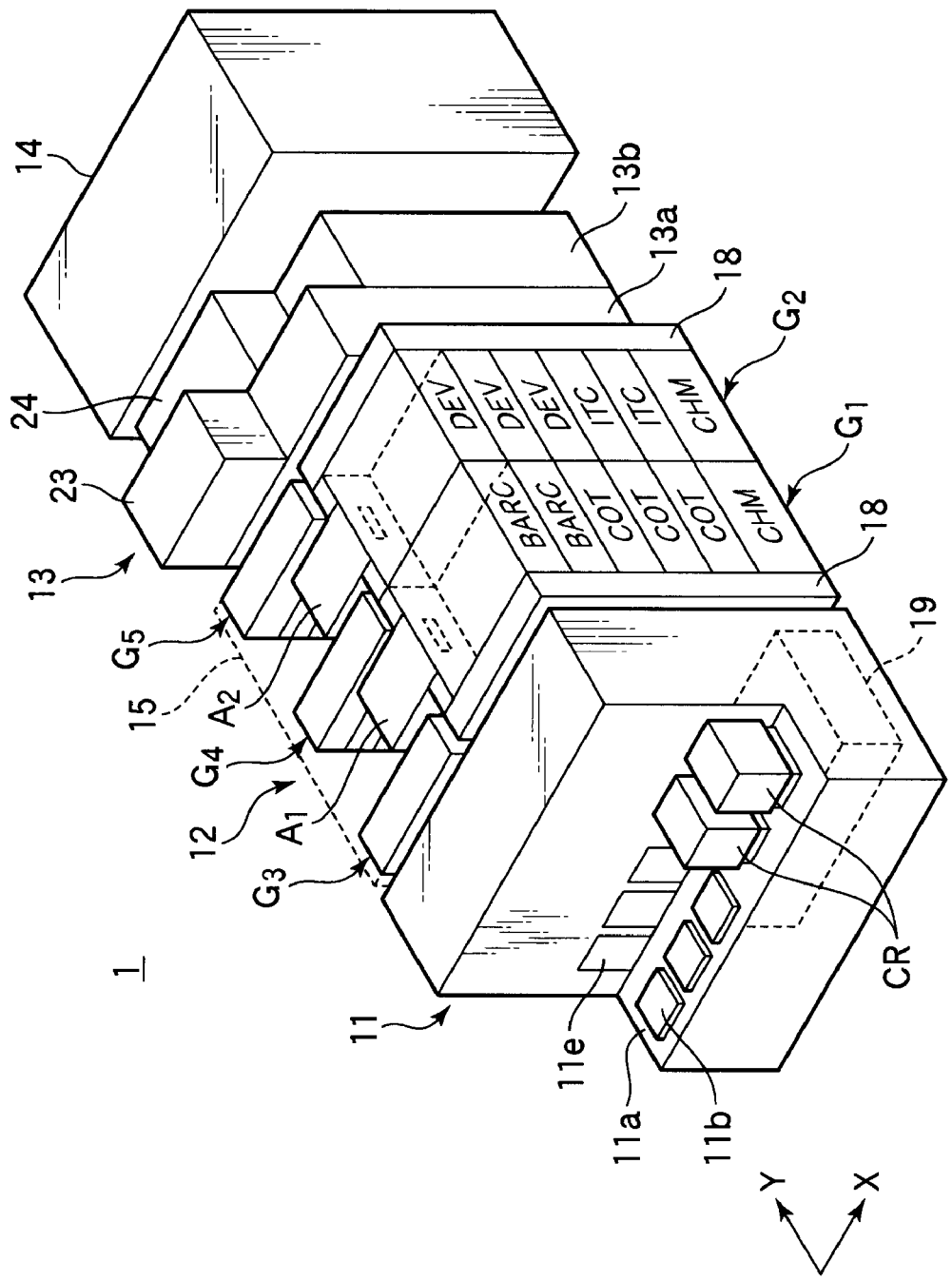
FIG. 2 is a perspective view schematically showing the pattern forming apparatus.

FIG. 1 is a plan view schematically showing the layout of a pattern forming apparatus including a post-cleaning unit (POCLN) for processing semiconductor wafers, according to an embodiment of the present invention. FIG. 2 is a perspective view schematically showing the pattern forming apparatus. The pattern forming apparatus 1 is designed to form a predetermined resist pattern on a semiconductor substrate or wafer W. This pattern forming apparatus 1 includes a cassette station 11 used as a transfer station for wafers W, a process station 12 comprising a plurality of processing units each for performing a predetermined process on a wafer W, a light exposure apparatus 14 for performing a light exposure process on a wafer W, and an interface station 13 for transferring wafers W between the process station 12 and light exposure apparatus 14. The cassette station 11, process station 12, interface station 13, and light exposure apparatus 14 are arrayed in series in this order in the longitudinal direction of the pattern forming apparatus 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transition unit located in a third processing unit group $G_3$ in the process station 12 described later. The cassette table 11a and wafer transfer mechanism 11c are arrayed in series in this order in the Y-direction. The cassette table 11a has a plurality of, such as 5, positioning portions 11b each for positioning a wafer cassette (CR), arrayed thereon in the width direction of the pattern forming apparatus 1 (X-direction). A wafer cassette (CR) is placed at each of the positioning portions 20a such that its transfer port faces an opening/closing portion lie formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transition unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$.

The first processing unit group $G_1$ includes a plurality of processing units stacked one on the other, which are formed of, e.g., two bottom coating units (BARC) for forming an anti-reflective coating that prevents reflection of light during light exposure on a wafer W, and three resist coating units (COT) for forming a resist film on a wafer W. The second processing unit group $G_2$ includes a plurality of processing units stacked one on the other, which are formed of, e.g., three development units (DEV) for performing a development process on a wafer W, and two top coating units (ITC) for forming a hydrophobic protection film on the surface of a resist film formed on a wafer W.

Each of the third processing unit group $G_3$, fourth processing unit group $G_4$, and fifth processing unit group $G_5$ includes a plurality of, such as 10, processing units stacked one on the other, which are formed of, e.g., an adhesion unit for performing a hydrophobic process on a wafer W, a pre-baking unit for performing a heating process on a wafer W after resist coating, a post-baking unit for performing a heating process on a wafer W after development, a post-exposure baking unit for performing a heating process on a wafer W after light exposure and before development, and so forth. The third processing unit group $G_3$ includes a transition unit through which wafers W are transferred between the cassette station 11 and first main transfer section $A_1$. The fifth processing unit group $G_5$ includes a transition unit through which wafers W are transferred between the second main transfer section $A_2$ and a first wafer transfer member 21 used in the interface station 13 described later.

The first main transfer section $A_1$ is provided with a first main wafer transfer arm 16 for handling wafers W, which can selectively access the units located in the first processing unit group $G_1$, third processing unit group $G_3$, and fourth processing unit group $G_4$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13. Each of the temperature/humidity adjusting units 18 includes a temperature adjusting device for process liquids to be supplied to the first and second processing unit groups $G_1$ and $G_2$, and a duct for adjustment of temperature and humidity. Chemical unit (CHM) are respectively disposed below the first and second processing unit groups $G_1$ and $G_2$, for supplying chemical solutions to the first and second processing unit groups $G_1$ and $G_2$.

Figure 3:
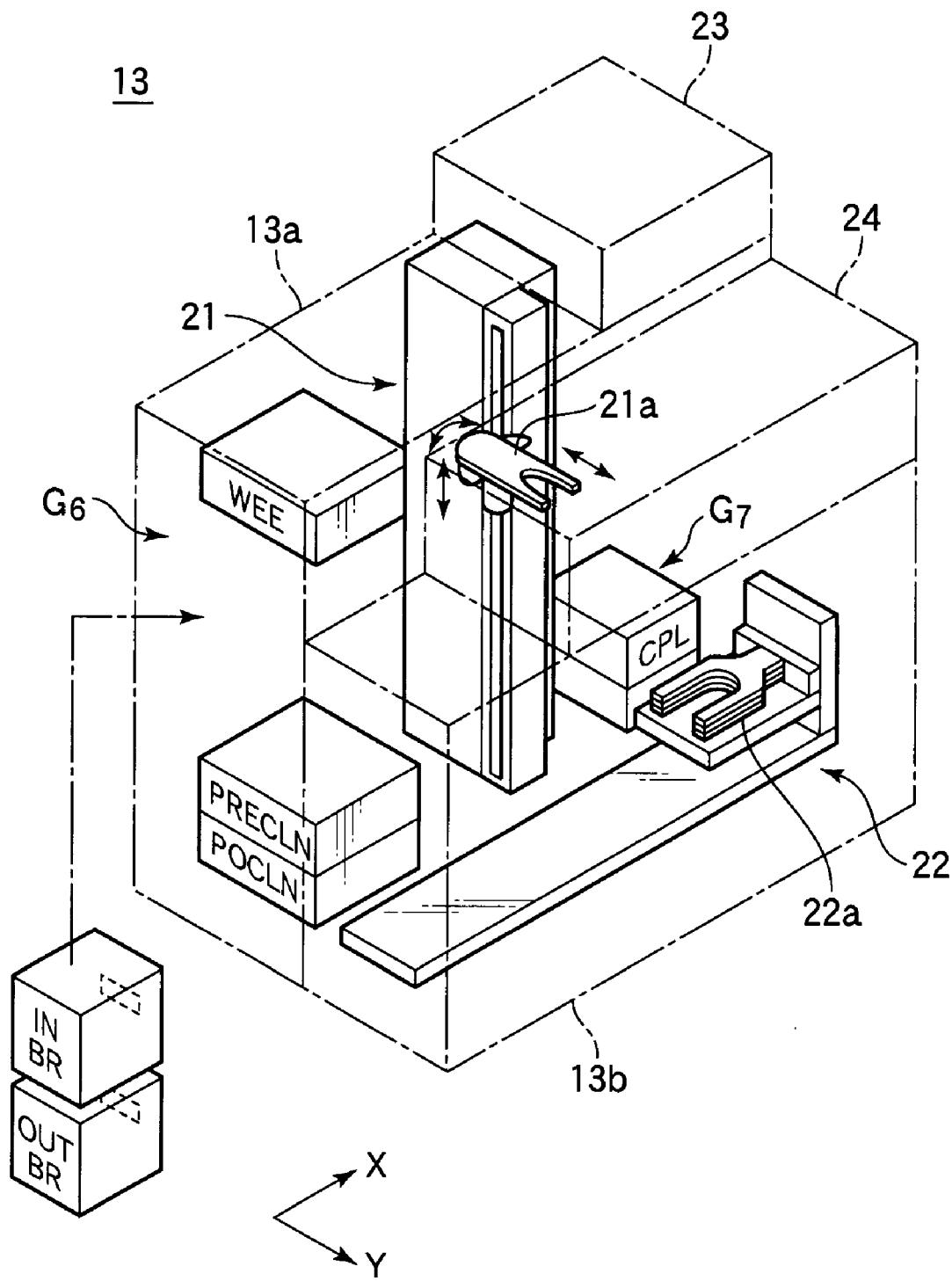
FIG. 3 is a perspective view schematically showing an interface station used in the pattern forming apparatus.

FIG. 3 is a perspective view schematically showing the interface station 13 used in the pattern forming apparatus 1. The interface station 13 has a casing that defines a first interface station 13a on the process station 12 side and a second interface station 13b on the light exposure apparatus 14 side. The first interface station 13a is provided with a first wafer transfer member 21 disposed to face an opening portion of the fifth processing unit group $G_5$ for transferring wafers W. The second interface station 13b is provided with a second wafer transfer member 22 movable in the X-direction for transferring wafers W.

A sixth processing unit group $G_6$ is located on the front side of the first interface station 13a, and includes, e.g., a periphery light exposure unit (WEE), an incoming buffer cassette (INBR), an outgoing buffer cassette (OUTBR), a pre-cleaning unit (PRECLN), and a post-cleaning unit (POCLN), stacked one on the other. The periphery light exposure unit (WEE) is used for performing light exposure selectively only on the edge portion of a wafer W to remove unnecessary resist portion near the edge of the wafer. The incoming buffer cassette (INBR) is used for temporarily placing wafers W to be transferred into the light exposure apparatus 14. The outgoing buffer cassette (OUTBR) is used for temporarily placing wafers W transferred from the light exposure apparatus 14. The pre-cleaning unit (PRECLN) is used for cleaning a wafer to be transferred into the light exposure apparatus 14. The post-cleaning unit (POCLN) is used for cleaning a wafer transferred from the light exposure apparatus 14. A seventh processing unit group $G_7$ is located on the rear side of the first interface station 13a, and includes, e.g., two high-precision temperature adjusting units (CPL), stacked one on the other, for adjusting the temperature of a wafer W with high precision.

The first wafer transfer member 21 includes a fork 21a for transferring wafers W. The fork 21a can selectively access the units located in the fifth processing unit group $G_5$, sixth processing unit group $G_6$, and seventh processing unit group $G_7$ to transfer wafers W between these units.

The second wafer transfer member 22 includes a fork 22a for transferring wafers W. The fork 22a can selectively access the pre-cleaning unit (PRECLN) and post-cleaning unit (POCLN) of the sixth processing unit group $G_6$, the units located in the seventh processing unit group $G_7$, and an incoming stage 14a and an outgoing stage 14b of the light exposure apparatus 14 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus.

As described above, the process station 12 includes the resist coating units (COT) for applying a resist onto a wafer W to form a film, the development units (DEV) for developing a resist film after light exposure performed by the light exposure apparatus 14, and so forth. The interface station 13 includes the pre-cleaning unit (PRECLN) for cleaning a wafer W after resist coating and before light exposure, and the post-cleaning unit (POCLN) for cleaning a wafer W after light exposure and before development. Accordingly, the process station 12 and interface station 13 constitute a resist coating/developing section.

The light exposure apparatus 14 includes an incoming stage 14a for placing thereon wafers W transferred from the interface station 13, and an outgoing stage 14b for placing thereon wafers W to be transferred to the interface station 13. The light exposure apparatus 14 further includes an immersion light exposure section 30 structured to subject a resist film formed on a wafer W to light exposure while immersing the resist film in a predetermined liquid (which will be referred to as "immersion liquid"). A wafer transfer mechanism 25 is disposed to transfer wafers W between the incoming stage 14a, immersion light exposure section 30, and outgoing stage 14b.

Figure 4:
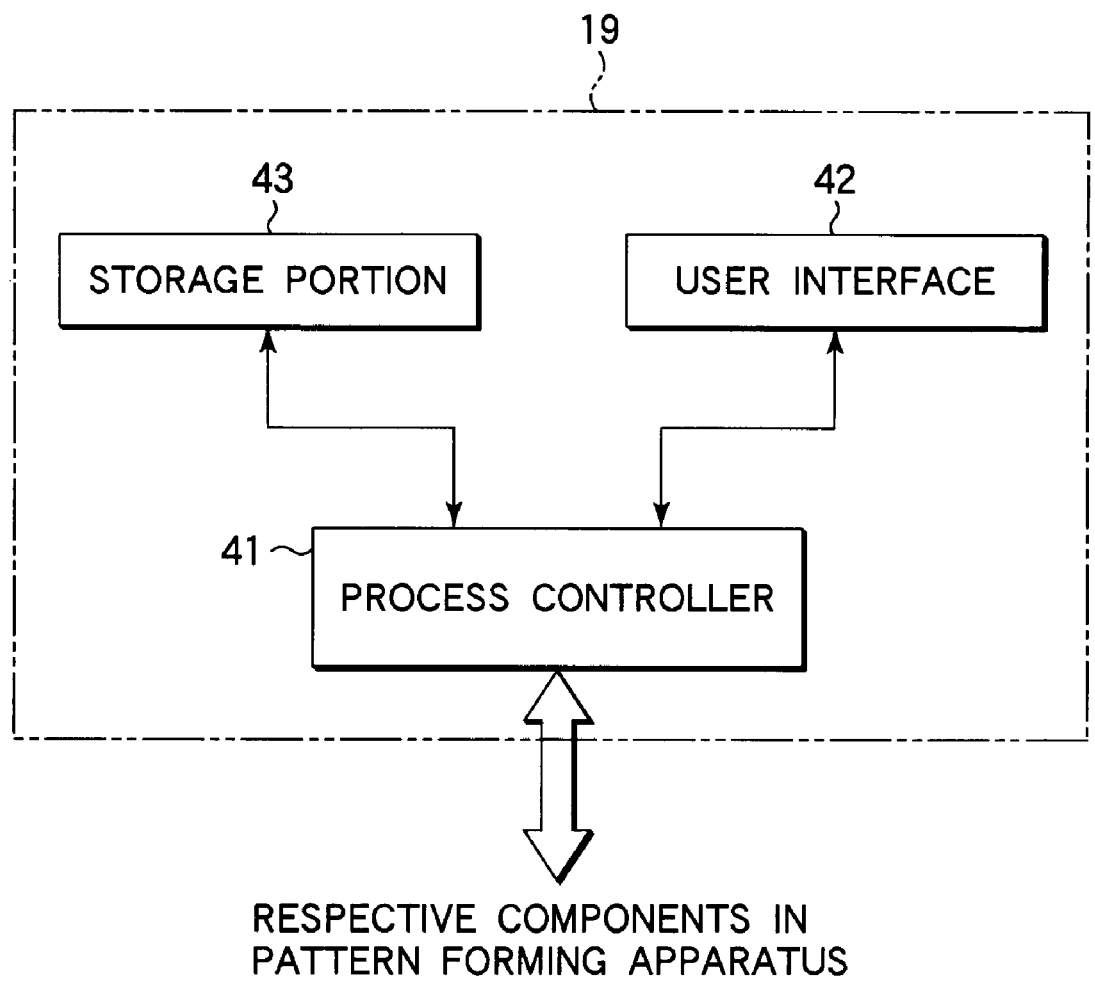
FIG. 4 is a block diagram showing a control system used in the pattern forming apparatus.

As shown in FIG. 2, a central control section 19 is located below the cassette station 11 and is used for controlling this pattern forming apparatus 1, as a whole. As shown in FIG. 4, this central control section 19 includes a process controller 41 comprising a CPU for controlling the respective components included in the pattern forming apparatus 1, such as the processing units and transfer mechanisms. The process controller 41 is connected to a user interface 42, which includes, e.g., a keyboard and a display, wherein the keyboard is used for a process operator to input commands for operating the respective components in the pattern forming apparatus 1, and the display is used for showing visualized images of the operational status of the respective components in the pattern forming apparatus 1. Further, the process controller 41 is connected to the storage portion 43, which stores recipes with control programs and process condition data recorded therein, for realizing various processes performed in the pattern forming apparatus 1 under the control of the process controller 41.

A required recipe is retrieved from the storage portion 43 and executed by the process controller 41 in accordance with an instruction or the like input through the user interface 42. Consequently, each of various predetermined processes is performed in the pattern forming apparatus 1 under the control of the process controller 41. Recipes may be stored in a computer readable storage medium, such as a CD-ROM, hard disk, flexible disk, or nonvolatile memory. Further, recipes may be utilized on-line, while it is transmitted from a suitable apparatus through, e.g., a dedicated line, as needed. The processing units are respectively provided with their own subordinate unit controllers, which control the operation of the respective units in accordance with instructions transmitted from the process controller 41.

In the pattern forming apparatus 1 arranged as described above, wafers W are taken out one by one from a wafer cassette (CR) by the transfer pick 11d of the wafer transfer mechanism 11c. A wafer W thus taken out is transferred by the transfer pick 11d into the transition unit of the third processing unit group $G_3$ of the process station 12. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to an adhesion process in the adhesion unit, formation of a resist film in one of the resist coating units (COT)), and a pre-baking process in the pre-baking unit in this order. As needed, the wafer W is subjected to formation of a protection film on the resist film in one of the top coating units (ITC). In place of the adhesion process, the wafer W may be subjected to formation of an anti-reflective coating in one of the bottom coating units (BARC) before formation of the resist film. Further, the formation of an anti-reflective coating on the resist film may be followed by formation of a protection film on the anti-reflective coating.

After the wafer W is subjected to a series of processes in the process station 12, the wafer W is transferred to the transition unit of the fifth processing unit group $G_5$. Then, the wafer W is sequentially transferred by the first wafer transfer member 21 through the periphery light exposure unit (WEE), incoming buffer cassette (INBR), pre-cleaning unit (PRECLN), and high-precision temperature adjusting unit (CPL), so that the wafer W is subjected to a series of processes. Then, the wafer W is transferred by the second wafer transfer member 22 to the incoming stage 14a of the light exposure apparatus 14. Then, the wafer W is transferred by the wafer transfer mechanism 25 to the immersion light exposure section 30, in which the wafer W is subjected to a light exposure process.

After the light exposure is finished in the immersion light exposure section 30, the wafer W is transferred by the wafer transfer mechanism 25 to the outgoing stage 14b. Then, the wafer W is transferred by the second wafer transfer member 22 to the post-cleaning unit (POCLN), in which the wafer W is subjected to cleaning. Thereafter, the wafer W is transferred by the first wafer transfer member 21 to the transition unit of the fifth processing unit group $G_5$. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to a post-exposure baking process in the post-exposure baking unit, a developing process in one of the development units (DEV), and a post-baking process in the post-baking unit in this order. Then, the wafer W is transferred to the transition unit of the third processing unit group $G_3$, and is further transferred to a wafer cassette (CR) placed on the cassette station 11.

In this embodiment, the surface of a wafer W needs to be hydrophobic, so that a sufficient liquid resistance is ensured against the immersion liquid and the immersion head can be moved at a sufficient scanning speed during the immersion light exposure performed in the light exposure apparatus 14. Accordingly, a hydrophobic resist film may be used, or a hydrophobic protection film may be formed on the surface of a resist film in one of the top coating units (ITC). However, in this case, when a development process is performed on the wafer W, the hydrophobic surface repels the development liquid and hinders the liquid from being filled on the wafer W, thereby making it difficult to form a predetermined resist pattern uniformly and reliably.

According to this embodiment in light of the problem described above, the post-cleaning unit (POCLN) is provided with a mechanism for turning the surface of a wafer into a hydrophilic state. After immersion light exposure and before development liquid application, the post-cleaning unit (POCLN) is used to perform a hydrophilic process for turning the surface (protection film surface) of a wafer W into a hydrophilic state, in addition to cleaning of the wafer W.

Figure 5:
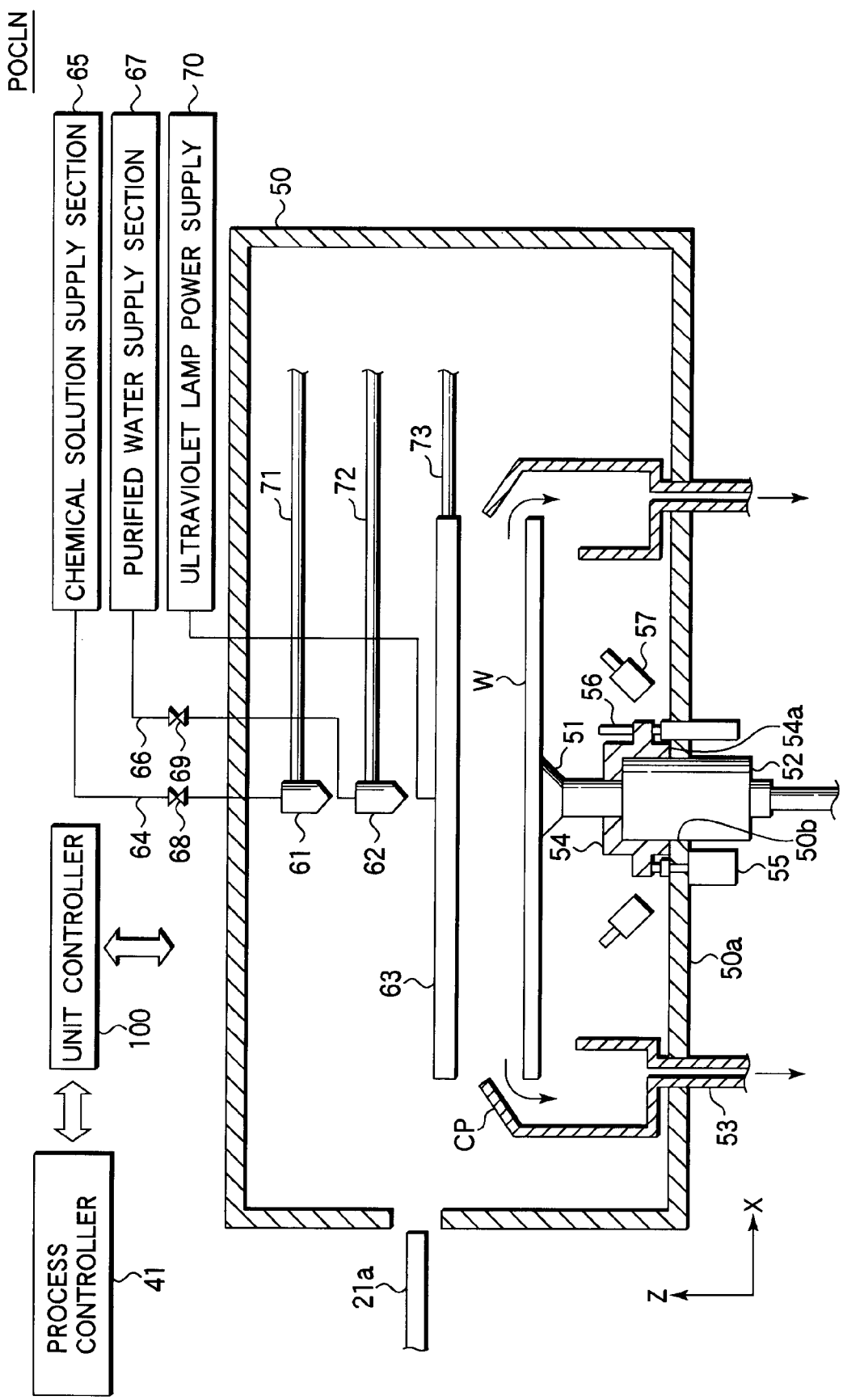
FIG. 5 is a sectional view showing the post-cleaning unit (POCLN)
Figure 6:
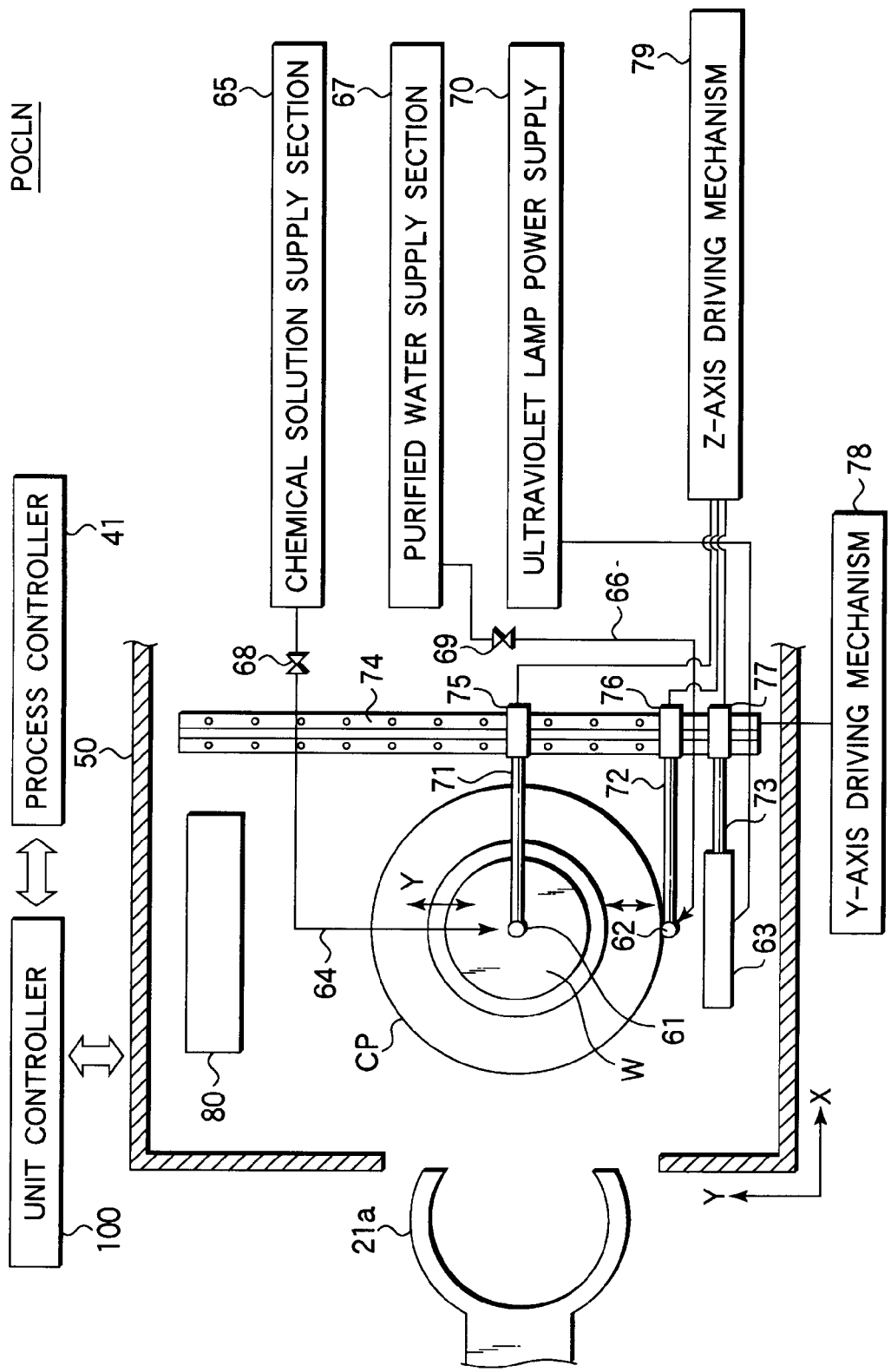
FIG. 6 is a plan view schematically showing the interior of the post-cleaning unit (POCLN)

Next, a detailed explanation will be given of the post-cleaning unit (POCLN) provided with a mechanism for turning the surface of a wafer W into a hydrophilic state. FIGS. 5 and 6 are a sectional view and a plan view, respectively, schematically showing the entire structure of the post-cleaning unit (POCLN) according to this embodiment.

The post-cleaning unit (POCLN) includes a casing 50, in which an annular cleaning cup (CP) is disposed at the center, and a spin chuck 51 is disposed inside the cleaning cup (CP). The spin chuck 51 is configured to hold the wafer W by a vacuum attraction force, and to rotate the wafer W by a driving motor 52. The cleaning cup (CP) has drain ports 53 formed at the bottom, to discharge therethrough a chemical solution used for the hydrophilic process and purified water used for the cleaning process.

The driving motor 52 is disposed to be movable up and down through an opening 50b formed in the bottom plate 50a of the casing 50, and is connected to an elevating mechanism 55 formed of, e.g., an air cylinder and an elevator guide 56 through a cap-like flange member 54 made of, e.g., aluminum. The flange member 54 is formed to cover the upper part of the driving motor 52.

When the hydrophilic process or cleaning process is performed on the wafer W, the lower end 54a of the flange member 54 comes into close contact with the bottom plate 50a near the rim of the opening 50b to airtightly seal the unit interior. When the wafer W is transferred between the spin chuck 51 and the fork 21a of the first wafer transfer member 21, the driving motor 52 and spin chuck 51 are moved upward by the elevating mechanism 55 to separate the lower end of the flange member 54 from the bottom plate 50a.

A chemical solution supply nozzle 61 and a purified water supply nozzle 62 are disposed above the cleaning cup (CP) to supply a chemical solution for turning the surface of the wafer W into a hydrophilic state and purified water, respectively, onto the surface of the wafer W. Further an ultraviolet lamp 63 having almost the same width as the wafer W is disposed above the cleaning cup (CP) to irradiate the wafer W with ultraviolet rays. The chemical solution supply nozzle 61, purified water supply nozzle 62, and ultraviolet lamp 63 are movable between a supply position above the wafer W and a waiting position outside the wafer W. The chemical solution supply nozzle 61 is connected through a chemical solution supply line 64 to a chemical solution supply section 65. The purified water supply nozzle 62 is connected through a purified water supply line 66 to a purified water supply section 67. The chemical solution supply line 64 is provided with a switching valve 68, and the purified water supply line 66 is provided with a switching valve 69. The ultraviolet lamp 63 is supplied with an electric power from an ultraviolet lamp power supply 70.

The chemical solution supply nozzle 61 is attached to the distal end of a first nozzle scan arm 71. The purified water supply nozzle 62 is attached to the distal end of a second nozzle scan arm 72. The ultraviolet lamp 63 is attached to the distal end of a third nozzle scan arm 73. The first, second, third nozzle scan arms 71, 72, and 73 are respectively attached to the upper ends of a first vertical support member 75, a second vertical support member 76, and a third vertical support member 77. The first, second, third vertical support members 75, 76, and 77 stand on a guide rail 74 extending in the Y-direction on the bottom plate 50a of the casing 50 and are horizontally movable along the guide rail 74. The chemical solution supply nozzle 61, purified water supply nozzle 62, and ultraviolet lamp 63 are moved in the Y-direction along with the first, second, third vertical support members 75, 76, and 77, respectively, by a Y-axis driving mechanism 78. Further, first, second, third vertical support members 75, 76, and 77 are movable in a z-direction by a Z-axis driving mechanism 79. A nozzle waiting position 80 is prepared for the chemical solution supply nozzle 61 to wait at this position.

Rinsing nozzles 57 for a back rinsing process are disposed around a lower portion of the spin chuck 51 to deliver a rinsing liquid, such as purified water, onto the back surface of the wafer W so as to clean the back surface of the wafer W.

The post-cleaning unit (POCLN) is provided with a unit controller 100 for controlling the post-cleaning unit (POCLN) in accordance with instructions transmitted from the process controller 41 of the pattern forming apparatus 1. The unit controller 100 controls the operation of the spin chuck 51 by the driving motor 52, as well as the operation of the Y-axis driving mechanism 78, Z-axis driving mechanism 79, chemical solution supply section 65, purified water supply section 67, and ultraviolet lamp power supply 70.

The pre-cleaning unit (PRECLN) has a structure equivalent to the post-cleaning unit (POCLN) except that it does not include the chemical solution supply system and ultraviolet ray radiation mechanism.

Next, an explanation will be given of a processing method performed in the post-cleaning unit (POCLN).

Figure 7:
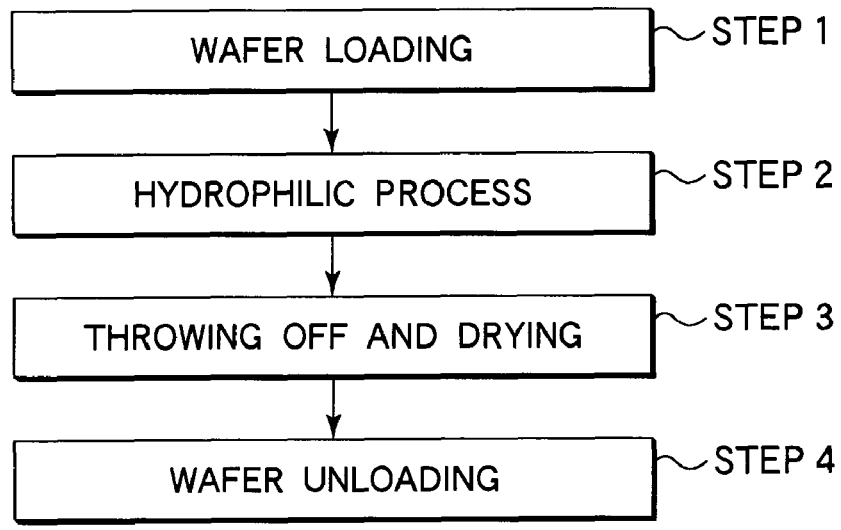
FIG. 7 is a flow chart for explaining a first processing method performed in the post-cleaning unit (POCLN)

FIG. 7 is a flow chart showing a first processing method. According to this method, at first, a wafer W with a resist film formed thereon is loaded (STEP 1) after the resist film is subjected to light exposure in accordance with a predetermined pattern by immersion light exposure. Specifically, the wafer W is transferred by the fork 21a of the first wafer transfer member 21 into the post-cleaning unit (POCLN). Then, the spin chuck 51 is moved up by the elevating mechanism 55, so that the wafer W is held on the spin chuck 51 by a vacuum attraction force. Then, the wafer W is moved down to a predetermined position inside the cleaning cup (CP), and the chemical solution supply nozzle 61 is moved to a position above the center of the spin chuck 51 (the center of the wafer). In this state, a hydrophilic process is performed while the wafer W is rotated by the driving motor 52 and a chemical solution for turning the surface of the wafer W into a hydrophilic state is supplied onto the wafer W (STEP 2). At this time, the chemical solution supplied on the surface of the wafer W is uniformly spread from the center of the wafer W over the entirety of the wafer W by a centrifugal force, while the hydrophilic process is performed on the wafer W. As the chemical solution of the hydrophilic process, an acid solution is preferably used. Where an acid solution is used, a de-protection reaction is caused such that protection groups on the resist surface or protection film surface are dissociated by acid ($H^+$), and hydroxyl groups ($OH^-$) replace these portions, thereby forming a hydrophilic state. Consequently, the resist film surface or protection film surface becomes soluble in TMAH, which is the main component of the development liquid, so the entire wafer surface can be wetted with the development liquid. As the acid solution, a weak acid solution, such as a dilute acid, may be used. Preferable examples are acetic acid, formic acid, hydrochloric acid, sulfuric acid, perfluoroalkylsulfonic acid. Where perfluoroalkylsulfonic acid is used, it is preferable that the alkyl long chain is set to satisfy n=1 to 4 and the concentration is set to be $10^{-3}$ to $10^{-1}$N. At this time, the rotation number of the wafer W is set to be, e.g., 100 to 500 rpm. In this first processing method, the hydrophilic process of STEP 2 also serves as a cleaning process of the wafer W. In other words, both of the hydrophilic process and cleaning process are performed by use of a chemical solution for turning the surface into a hydrophilic state.

After the hydrophilic process is thus performed, the spin chuck 51 is rotated at a high speed rotated to throw off the chemical solution and dry the wafer W (STEP 3). This operation is preferably performed for about 15 seconds while the rotation number of the wafer W is set to be 1,500 to 2,500 rpm.

After the drying process is performed on the wafer W, the spin chuck 51 is moved up by the elevating mechanism 55, and then the wafer W is unloaded from the post-cleaning unit (POCLN) by the fork 21a of the first wafer transfer member 21 (STEP 4).

According to this first method, the hydrophilic process using a chemical solution turns the hydrophobic surface of the wafer W into a hydrophilic surface to allow the entire surface to be wetted with the development liquid in the subsequent development process. Further, this process also serves as a cleaning process of the wafer surface, thereby shortening the recipe. It should be noted that this effect is obtained where the chemical solution has a cleaning effect.

After the process performed in the cleaning process unit (POCLN), the wafer W is transferred to the post-exposure baking unit, in which the wafer W is subjected to a post-exposure baking process (baking after light exposure). Then, the wafer W is transferred by the second main wafer transfer apparatus 17 to the development unit (DEV), in which the development liquid is filled on the surface of the wafer W. At this time, the development liquid can be filled on the surface of the wafer W, i.e., the resist film surface or protection film surface, without being repelled by the surface, because the surface has been turned into a hydrophilic state by the post-cleaning unit (POCLN) to allow the entire surface to be wetted with the development liquid, as described above. Consequently, the development process is uniformly and reliably performed on the wafer W, and thus a predetermined resist pattern can be uniformly and reliably formed.

Figure 8:
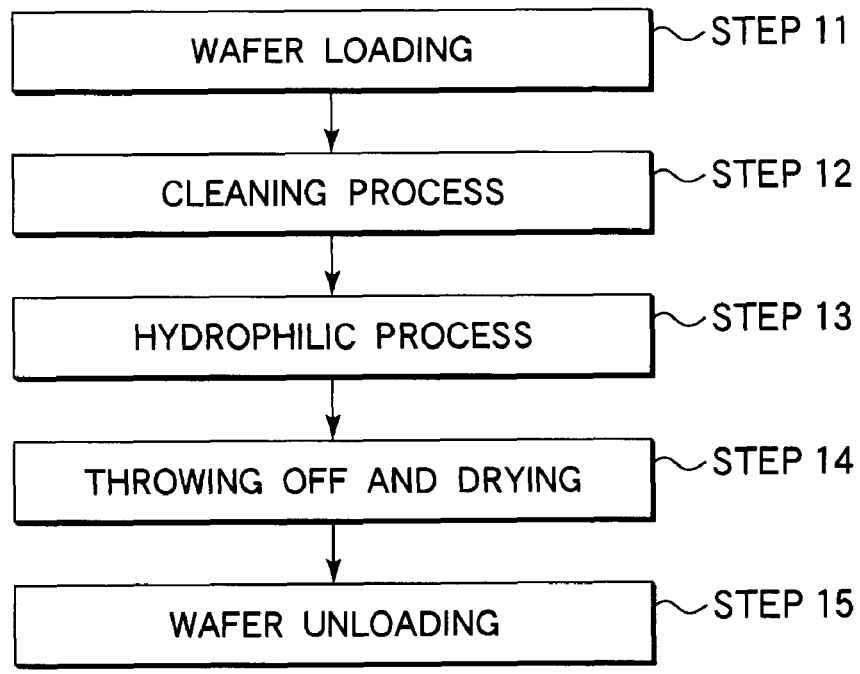
FIG. 8 is a flow chart for explaining a second processing method performed in the post-cleaning unit (POCLN)

Next, an explanation will be given of a second processing method. In the first processing method described above, a hydrophilic process also serving as cleaning of a wafer W is performed after the wafer W is loaded. On the other hand, in this second processing method, a cleaning process is performed before a hydrophilic process. FIG. 8 is a flow chart showing the second processing method.

According to this method, at first, a wafer W is loaded (STEP 11), as in STEP 1 of the first processing method described above. Specifically, after a resist film formed on the wafer W is subjected to light exposure in accordance with a predetermined pattern by immersion light exposure, the wafer W is transferred into the post-cleaning unit (POCLN), and is held on the spin chuck 51 by a vacuum attraction force. Then, the purified water supply nozzle 62 is moved to a position above the center of the spin chuck 51 (the center of the wafer), and a cleaning process of the wafer W is performed while the wafer W is rotated by the driving motor 52 and purified water is supplied onto the surface of the wafer W (STEP 12). At this time, the purified water supplied on the wafer W is uniformly spread from the center of the wafer W over the entirety of the wafer W by a centrifugal force, while the cleaning process is performed on the wafer W. Then, while the wafer W is kept rotated, the purified water supply nozzle 62 is retreated, and the chemical solution supply nozzle 61 is moved to a position above the center of the spin chuck 51 (the center of the wafer). Further, in this state, as in the first processing method, a hydrophilic process is performed while a chemical solution for turning the surface into a hydrophilic state is delivered from the chemical solution supply nozzle 61 (STEP 13). After the hydrophilic process is thus performed, the wafer W is rotated to throw off the liquid and dry the wafer W (STEP 14), as in STEP 3 of the first processing method described above. Then, the wafer W is unloaded from the post-cleaning unit (POCLN) (STEP 15).

According to this second method, since the cleaning process is performed before the hydrophilic process, particles are reliably removed from the surface of the wafer W even if the chemical solution for the hydrophilic process has a small cleaning effect.

Figure 9:
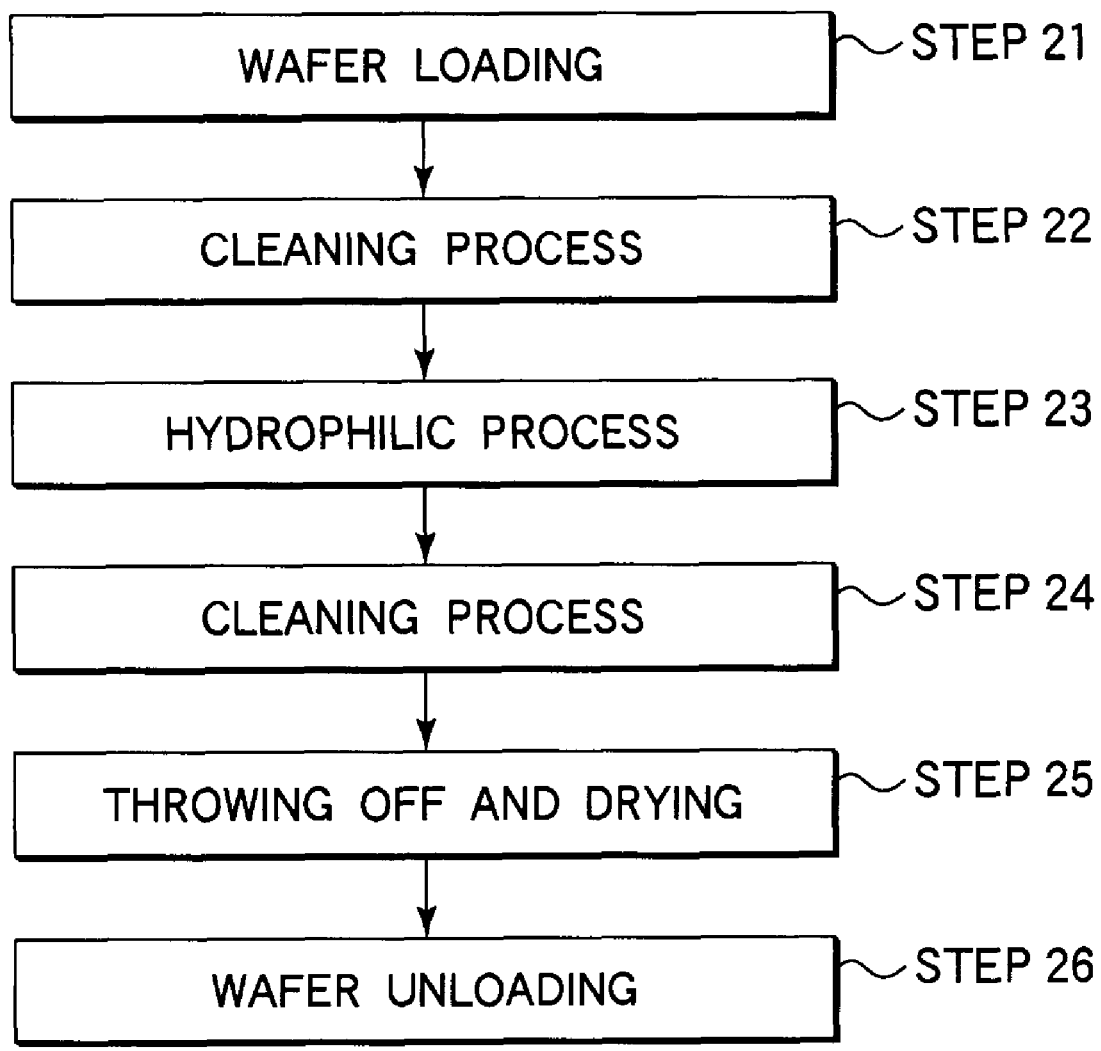
FIG. 9 is a flow chart for explaining a third processing method performed in the post-cleaning unit (POCLN)

Next, an explanation will be given of a third processing method. In the second processing method described above, a cleaning process is performed before a hydrophilic process. On the other hand, in this third processing method, a cleaning process is further performed after a hydrophilic process, in addition to a cleaning process performed before the hydrophilic process. FIG. 9 is a flow chart showing the third processing method.

According to this method, at first, as in STEPS 11 to 13 of the second processing method described above, a wafer W is loaded (STEP 21) and is then subjected to a cleaning process (STEP 22) and a hydrophilic process (STEP 23). Then, while the wafer W is kept rotated, the chemical solution supply nozzle 61 is retreated, and the purified water supply nozzle 62 is moved to a position above the center of the spin chuck 51 (the center of the wafer). Further, in this state, a cleaning process is performed while purified water is supplied from the purified water supply nozzle 62 (STEP 24). After the cleaning process is thus performed, the wafer W is rotated to throw off the liquid and dry the wafer W (STEP 25), as in STEP 3 of the first processing method described above. Then, the wafer W is unloaded from the post-cleaning unit (POCLN) (STEP 26).

According to this third method, the cleaning process is performed after the hydrophilic process to rinse away the chemical solution used for the hydrophilic process. This is effective if the chemical solution used for the hydrophilic process may adversely affect a subsequent process.

Figure 10:
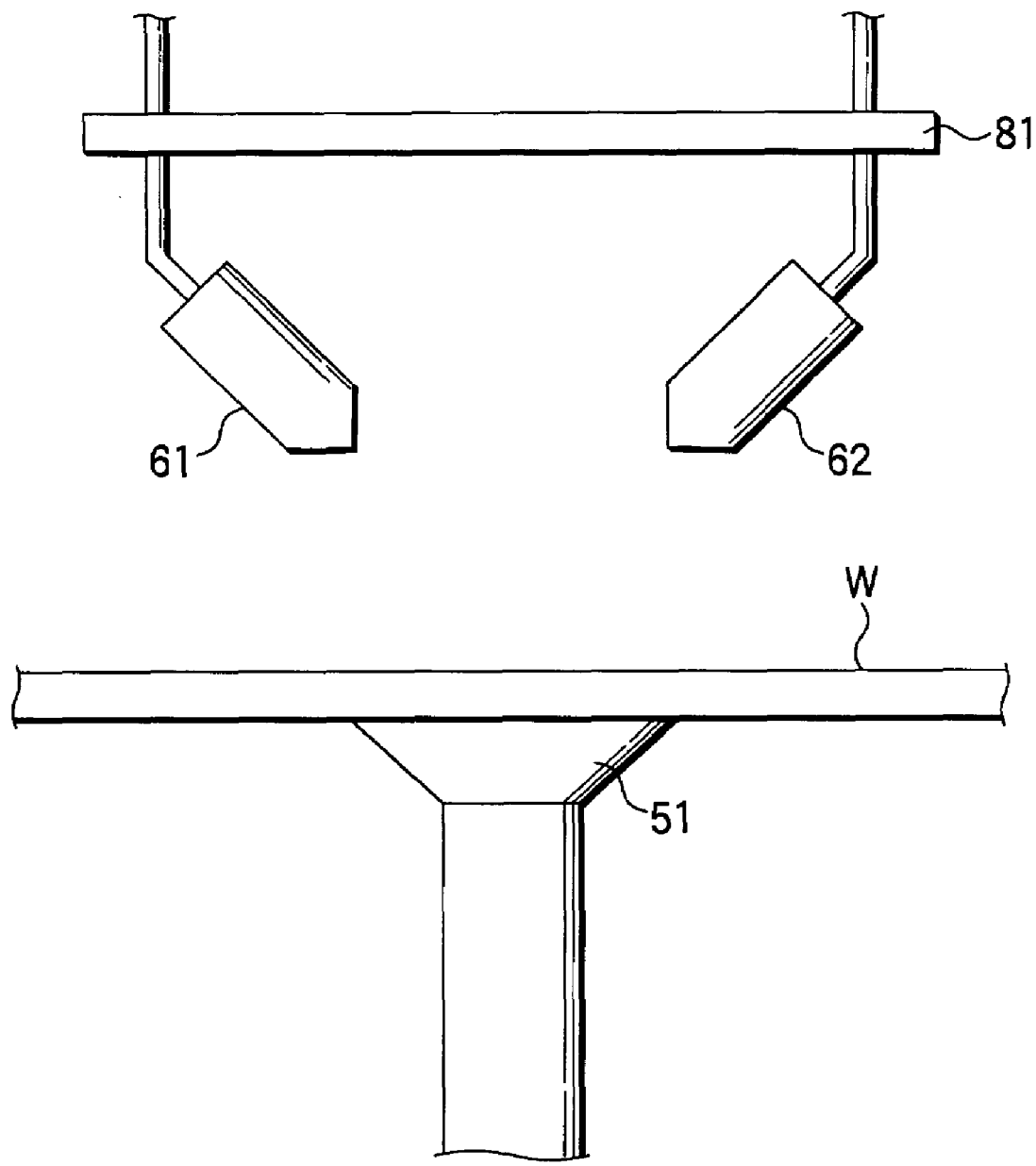
FIG. 10 is a view schematically showing an example of a supply system for chemical solution and purified water used in the post-cleaning unit (POCLN)
Figure 11:
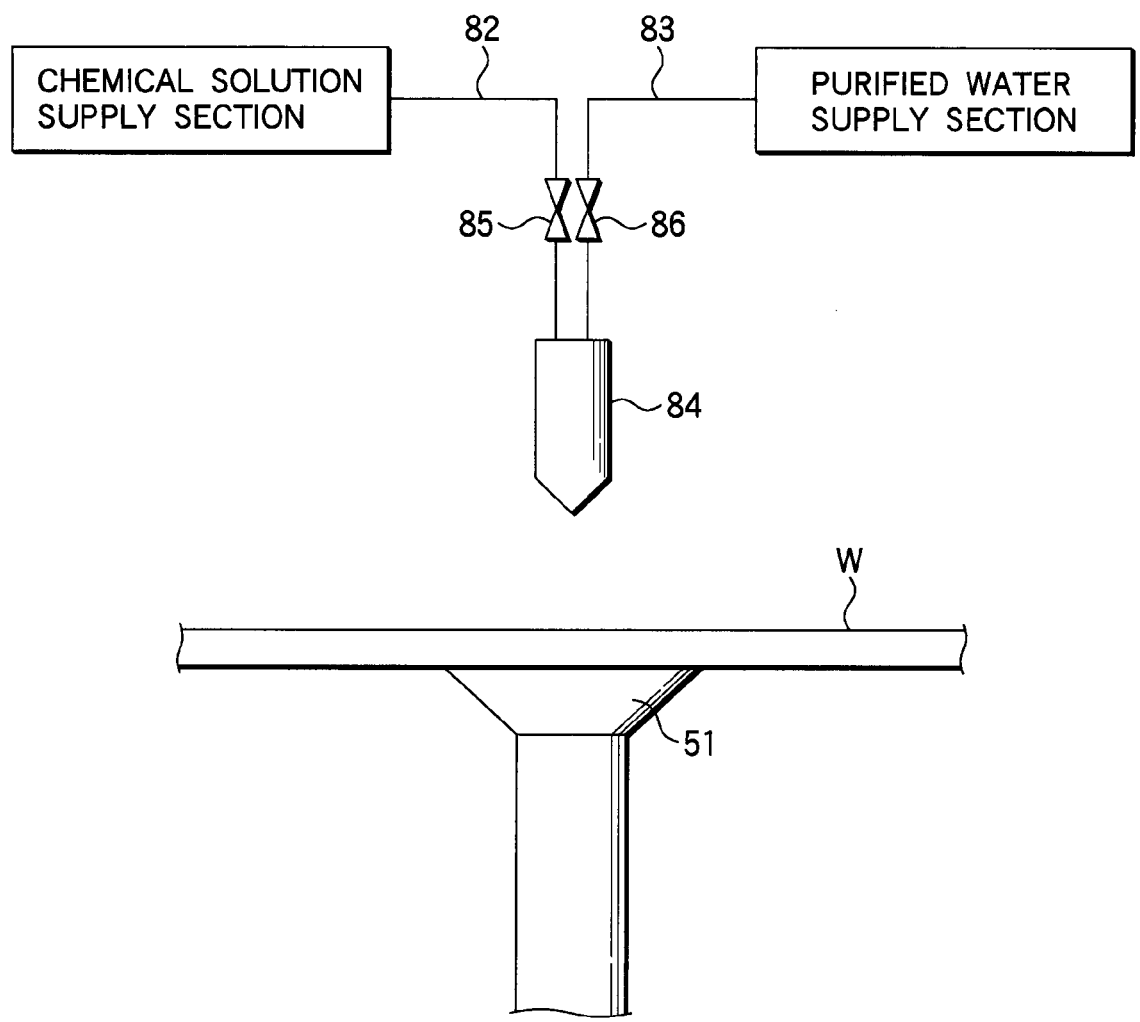
FIG. 11 is a view schematically showing another example of a supply system for chemical solution and purified water used in the post-cleaning unit (POCLN)
Figure 12:
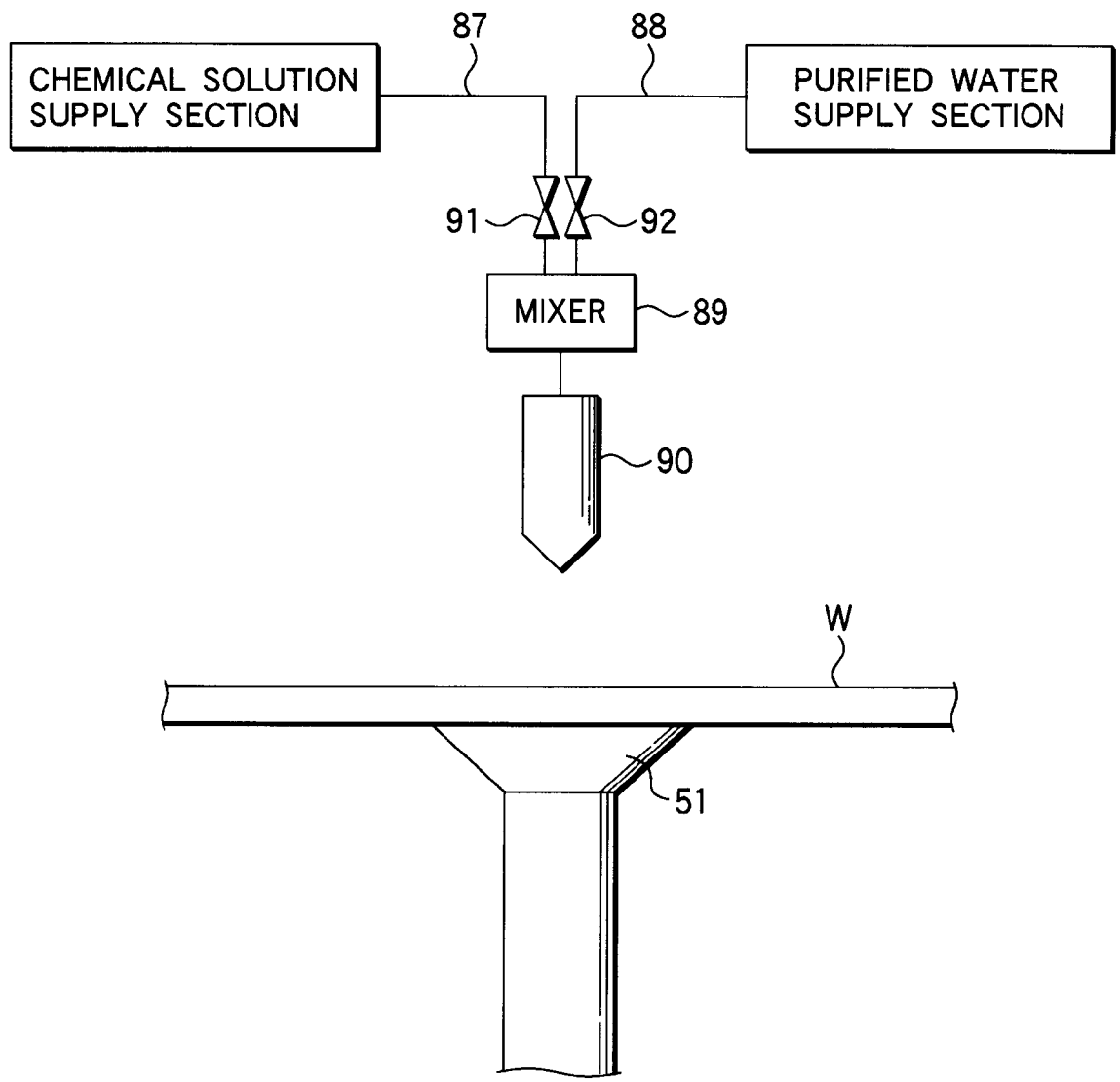
FIG. 12 is a view schematically showing another example of a supply system for chemical solution and purified water used in the post-cleaning unit (POCLN)

As in the second processing method and third processing method, where a chemical solution for the hydrophilic process and purified water for the cleaning process are supplied, the arrangement shown in FIG. 10 may be adopted to improve the cleaning efficiency, for example. As shown in FIG. 10, the chemical solution supply nozzle 61 and purified water supply nozzle 62 are attached to one arm 81 to supply both of the chemical solution and purified water onto the wafer W, and flow rate adjusting valves are disposed to gradually adjust the flow rate ratio between the chemical solution and purified water. For example, after the hydrophilic process using the chemical solution is performed, the flow rate of the chemical solution delivered from the chemical solution supply nozzle 61 is gradually decreased, and the flow rate of purified water delivered from the purified water supply nozzle 62 is gradually increased. This improves the efficiency of removing the chemical solution. In order to efficiently perform adjustment of the flow rate ratio between the chemical solution and purified water as described above, the arrangements shown in FIGS. 11 and 12 may be adopted. In the arrangement shown in FIG. 11, a chemical solution supply line 82 and a purified water supply line 83 is connected one liquid supply nozzle 84, and flow rate adjusting valves 85 and 86 are operated to adjust the flow rate ratio between the chemical solution and purified water delivered from the liquid supply nozzle 84. Alternatively, in the arrangement shown in FIG. 12, a chemical solution supply line 87 and a purified water supply line 88 are connected a mixer 89, so that the chemical solution and purified water are mixed within the mixer 89 to form a liquid mixture having a predetermined flow rate ratio, which is then delivered from a liquid supply nozzle 90.

Figure 13:
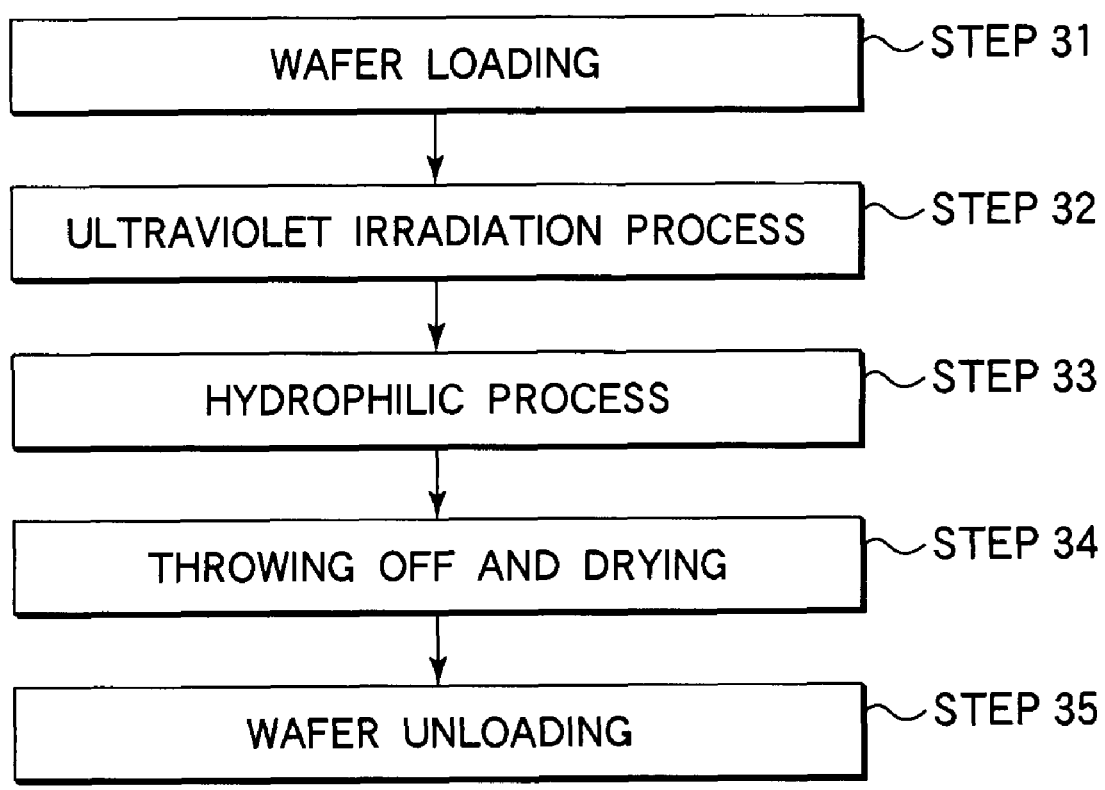
FIG. 13 is a flow chart for explaining a fourth processing method performed in the post-cleaning unit (POCLN)

Next, an explanation will be given of a fourth processing method. In this fourth processing method, the ultraviolet lamp 63 is used to assist a hydrophilic or cleaning process. Specifically, ultraviolet rays having predetermined wavelength are radiated from the ultraviolet lamp 63 onto the surface of a wafer W (protection film surface) to reform the surface of the wafer W, so that the effect of assisting the hydrophilic process and the effect of assisting the cleaning process performed on the surface of the wafer W are provided. In the first processing method described above, a hydrophilic process also serving as cleaning of a wafer W is performed after the wafer W is loaded. On the other hand, in this fourth processing method, an ultraviolet irradiation process is performed before a hydrophilic process. FIG. 13 is a flow chart showing the fourth processing method.

According to this method, at first, a wafer W is loaded (STEP 31), as in STEP 1 of the first processing method described above. Then, the ultraviolet lamp 63 is moved to a position above the center of the spin chuck 51 (the center of the wafer). In this state, while the wafer W is rotated by the driving motor 52, the entire surface of the wafer W is uniformly irradiated with ultraviolet rays having predetermined wavelength (STEP 32), to assist a hydrophilic and cleaning process to be performed on the surface of the wafer W. This operation is preferably performed for about 30 seconds while the rotation number of the wafer W is set to be 30 to 100 rpm. Then, while the wafer W is kept rotated, the ultraviolet lamp 63 is retreated, and the chemical solution supply nozzle 61 is moved to a position above the center of the spin chuck 51 (the center of the wafer). Further, in this state, a hydrophilic process is performed while a chemical solution is supplied from the chemical solution supply nozzle 61 onto the surface of the wafer W (STEP 33). After the hydrophilic process is thus performed, the wafer W is rotated to throw off the liquid and dry the wafer W (STEP 34), as in STEP 3 of the first processing method described above. Then, the wafer W is unloaded from the post-cleaning unit (POCLN) (STEP 35).

Figure 14:
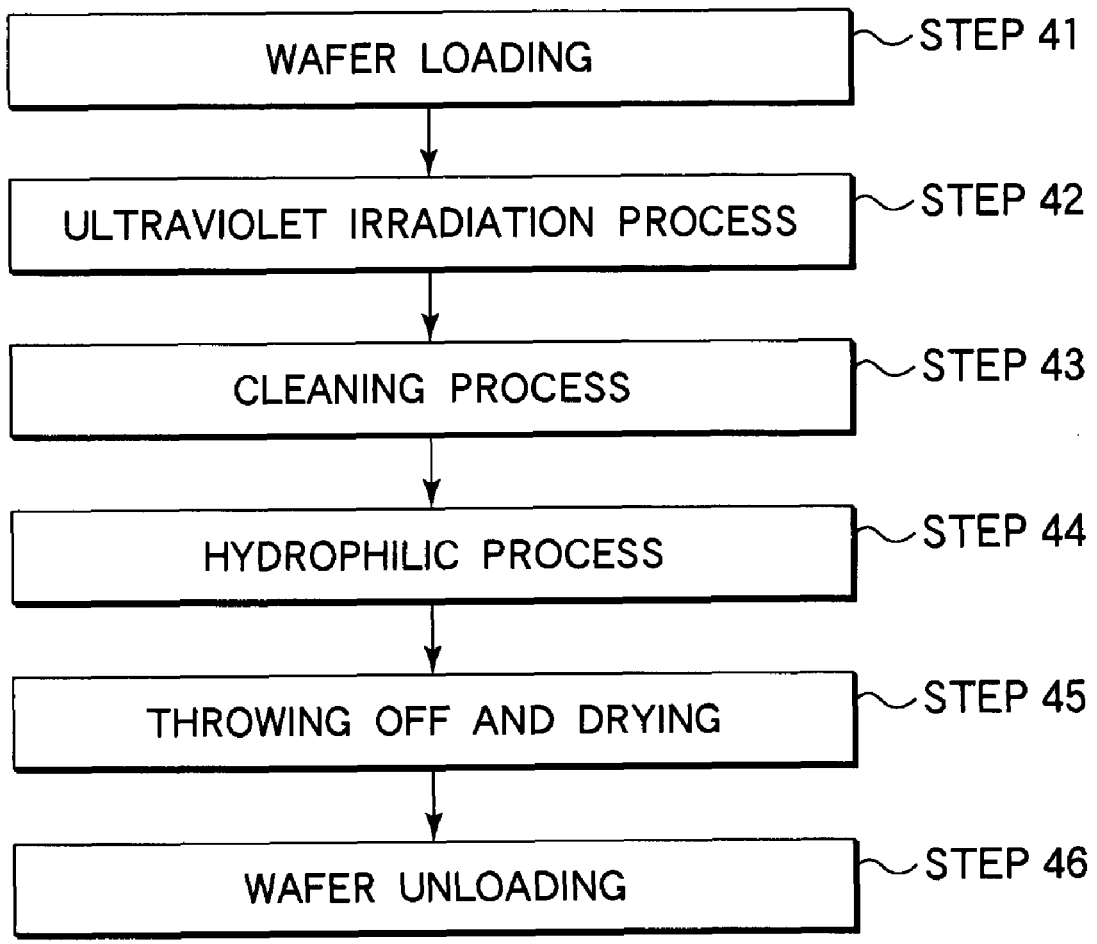
FIG. 14 is a flow chart for explaining a fifth processing method performed in the post-cleaning unit (POCLN)

Next, an explanation will be given of a fifth processing method. In the fourth processing method described above, an ultraviolet irradiation process is performed before a hydrophilic process. On the other hand, in this fifth processing method, a cleaning process is performed before the hydrophilic process in addition to the ultraviolet irradiation process. FIG. 14 is a flow chart showing the fifth processing method.

According to this method, at first, as in STEPS 31 and 32 of the fourth processing method described above, a wafer W is loaded (STEP 41) and is then subjected to an ultraviolet irradiation process (STEP 42). Then, while the wafer W is kept rotated, the ultraviolet lamp 63 is retreated, and the purified water supply nozzle 62 is moved to a position above the center of the spin chuck 51 (the center of the wafer). Further, in this state, a cleaning process is performed while purified water is supplied from the purified water supply nozzle 62 (STEP 43). After the cleaning process is thus performed, a hydrophilic process is performed (STEP 44), the wafer W is rotated to throw off the liquid and dry the wafer W (STEP 45), and the wafer W is unloaded from the post-cleaning unit (POCLN) (STEP 46), as in STEPS 33 to 35 of the fourth processing method described above.

According to this fifth method, since the cleaning process and hydrophilic process using a chemical solution are performed after the ultraviolet irradiation process, water droplets are reliably removed from the surface of the wafer W.

Figure 15:
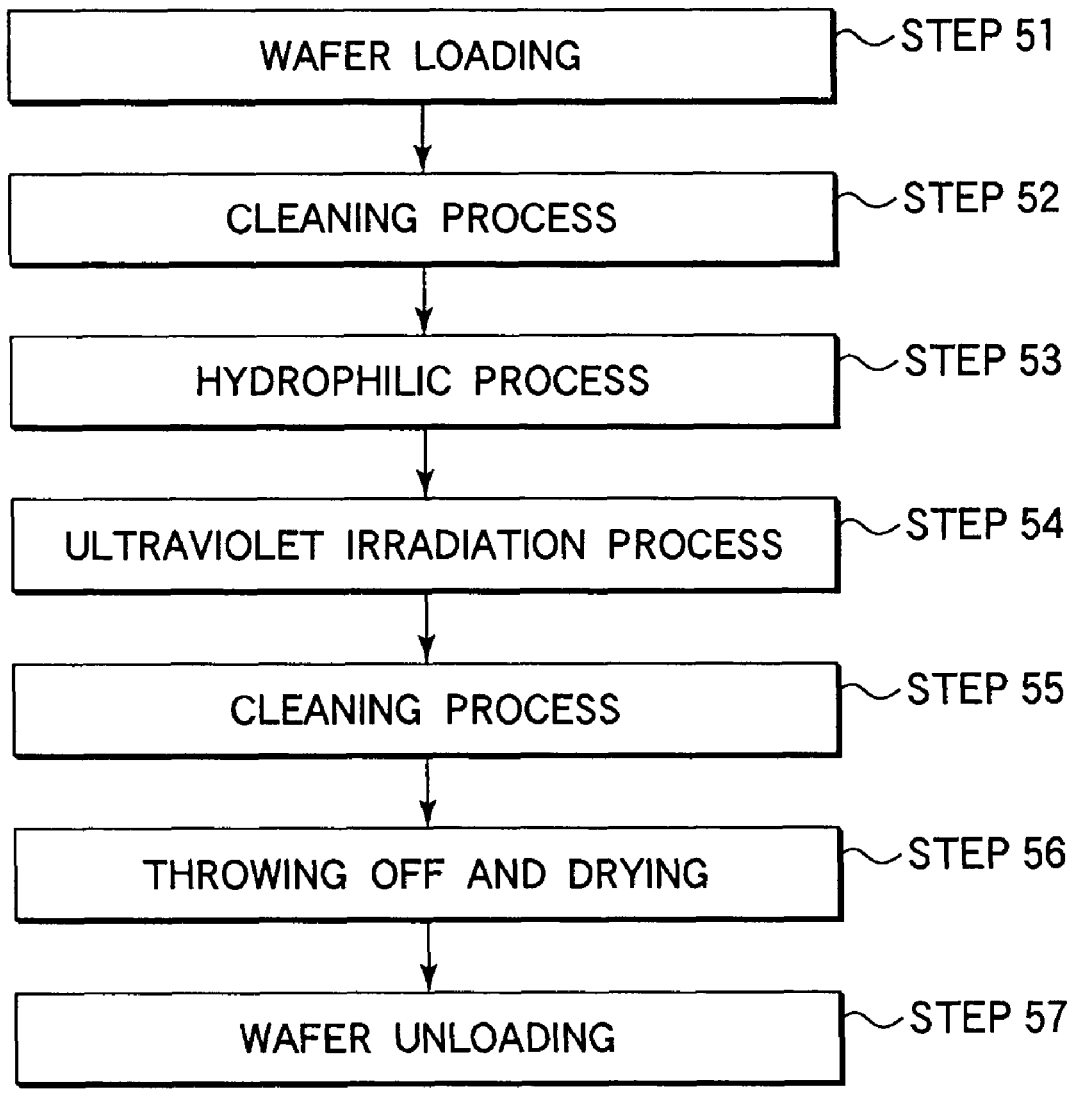
FIG. 15 is a flow chart for explaining a sixth processing method performed in the post-cleaning unit (POCLN).

Next, an explanation will be given of a sixth processing method. In the fifth processing method described above, a cleaning process is performed before a hydrophilic process. On the other hand, in this sixth processing method, a cleaning process, a hydrophilic process, and a cleaning process are performed in this order. FIG. 15 is a flow chart showing the sixth processing method.

According to this method, at first, as in STEPS 11 to 13 of the second processing method described above, a wafer W is loaded (STEP 51) and is then subjected to a cleaning process (STEP 52) and a hydrophilic process using a chemical solution (STEP 53). In STEP 53, after the chemical solution from the chemical solution supply nozzle 61 stops being supplied, the chemical solution supply nozzle 61 is retreated, and the ultraviolet lamp 63 is moved to a position above the center of the spin chuck 51 (the center of the wafer) and is used to radiate ultraviolet rays, thereby performing an ultraviolet irradiation process (STEP 54), while the wafer W is rotated to throw off the chemical solution and dry the wafer W. After the ultraviolet irradiation process is thus performed, a cleaning process is performed (STEP 55), the wafer W is rotated to throw off the liquid and dry the wafer W (STEP 56), and the wafer W is unloaded from the post-cleaning unit (POCLN) (STEP 57), as in STEPS 24 to 26 of the third processing method described above.

According to this sixth processing method, in the hydrophilic process of STEP 53 using a chemical solution, the ultraviolet irradiation process of STEP 54 is performed while the wafer W is rotated to throw off the liquid and dry the wafer W, so the processing time of the wafer W is shortened. Further, after the hydrophilic process, the ultraviolet irradiation process and cleaning process are performed to rinse away the chemical solution used for the hydrophilic process. This is effective if the chemical solution used for the hydrophilic process may adversely affect a subsequent process.

According to the embodiment of the present invention described above, a resist film is formed, or a resist film and protection film are sequentially formed on a substrate surface. Then, immersion light exposure is performed on the substrate with the resist film or the resist film and protection film formed thereon. Then, before development of a light exposure pattern, a chemical solution is supplied onto the substrate surface to turn the resist film surface or protection film surface into a hydrophilic state to allow the entire surface to be wetted with the development liquid. In general, the resist film surface or protection film surface is hydrophobic, so that a sufficient liquid resistance is ensured against the immersion liquid and the immersion head can be moved at a sufficient scanning speed during the immersion light exposure. However, the hydrophilic process allows the development liquid to be filled on the substrate surface without being repelled by the surface. Consequently, it is possible to prevent fluctuations in CD (Critical Dimension) and faults of the development process, such as generation of defects, thereby to uniformly and reliably form a predetermined resist pattern.

The present invention is not limited to the embodiment described above, and it may be modified in various manners. For example, in the embodiment described above, the hydrophilic process is performed in the post-cleaning process unit (POCLN). However, the hydrophilic process may be performed in another step after immersion light exposure and before development of a light exposure pattern. Further, in the embodiment described above, an acid solution is used for the hydrophilic process, but another chemical solution for turning the surface into a hydrophilic state may be used. In the embodiment described above, the hydrophilic process is performed while a chemical solution is supplied onto a wafer being rotated. However, another method, such as immersing a wafer in a chemical solution, may be used to perform a chemical solution process on the wafer. The hydrophilic process is not limited to a process using a chemical solution, and another hydrophilic process may be performed by, e.g., a process solely using an ultraviolet irradiation mechanism, such as the ultraviolet irradiation lamp used in the embodiment to assist the hydrophilic process. In place of the ultraviolet irradiation mechanism, a mechanism for radiating high energy rays, such as infrared rays, microwaves, heat rays, or electron rays, may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
preparing a target object in a coating section of an apparatus by forming a resist film on a substrate such that the resist film has a hydrophobic top surface;
then, performing immersion light exposure on the target object with the resist film having the hydrophobic top surface in an immersion light exposure section of the apparatus by subjecting the resist film to light exposure while immersing the resist film in a liquid, thereby forming a predetermined light exposure pattern on the resist film;
then, performing a hydrophilic process and a cleaning process at the same time on the target object on a spin chuck in a cleaning section of the apparatus by supplying a dilute acid solution onto the target object with the predetermined light exposure pattern formed on the resist film, the dilute acid solution being perfluoroalkylsulfonic acid having an alkyl long chain $(CF_2)_n$ of n=1 to 4 and set at a concentration of $10^{-3}$ to $10^{-1}$N, the hydrophilic process turning the hydrophobic top surface of the resist film into a hydrophilic top surface to be wetted with a development liquid overall;
then, spinning off the dilute acid solution from the target object by rotating the target object on the spin chuck in the cleaning section of the apparatus;
then, performing a heating process to promote an acid catalyst reaction for the resist film in a heating section of the apparatus; and
then, performing a development process on the target object with the resist film having the hydrophilic top surface by use of the development liquid in a development section of the apparatus, thereby forming a predetermined resist pattern from the resist film in accordance with the predetermined light exposure pattern.

2. The pattern forming method according to claim 1, wherein, in order to assist the hydrophilic process, the method further comprises radiating ultraviolet rays onto the target object on the spin chuck in the cleaning section of the apparatus.

3. The pattern forming method according to claim 2, wherein said radiating ultraviolet rays is prior to the hydrophilic process, and the method further comprises performing a pre-cleaning process on the target object on the spin chuck in the cleaning section of the apparatus by supplying purified water onto the target object between said radiating ultraviolet rays and the hydrophilic process.

4. The pattern forming method according to claim 2, wherein
said radiating ultraviolet rays is performed by positioning an ultraviolet emitter to face the target object on the spin chuck being rotated, then ultraviolet emitter having substantially the same width as the target object.

5. The pattern forming method according to claim 4, wherein the method further comprises performing a pre-cleaning process on the target object on the spin chuck in the cleaning section of the apparatus by supplying purified water onto the target object between the immersion light exposure and the hydrophilic process.

6. The pattern forming method according to claim 4, wherein the method further comprises performing a post-cleaning process on the target object on the spin chuck in the cleaning section of the apparatus by supplying purified water onto the target object between the hydrophilic process and the heating process.

7. The pattern forming method according to claim 1, wherein the method further comprises performing a pre-cleaning process on the target object on the spin chuck in the cleaning section of the apparatus by supplying purified water onto the target object between the immersion light exposure and the hydrophilic process.

8. The pattern forming method according to claim 1, wherein the hydrophobic top surface is a surface of a hydrophobic main body of the resist film.

9. The pattern forming method according to claim 1, wherein the hydrophobic top surface is a surface of a hydrophobic coating that covers a main body of the resist film, and the target object is prepared in the coating section of the apparatus by forming the main body of the resist film on the substrate and then covering the main body with the coating.

10. The pattern forming method according to claim 1, wherein the method further comprises
performing a post-cleaning process on the target object on the spin chuck in the cleaning section of the apparatus by supplying purified water onto the target object between the hydrophilic process and the heating process, and
setting a transition period of supplying the dilute acid solution and the purified water onto the target object at the same time when starting the post-cleaning process, such that the transition period gradually decreases a flow rate of the dilute acid solution while gradually increasing a flow rate of the purified water.

11. The pattern forming method according to claim 1, wherein, in order to assist the hydrophilic process, the method further comprises radiating ultraviolet rays onto the target object while said spinning off the dilute acid solution from the target object by rotating the target object on the spin chuck in the cleaning section of the apparatus, such that said radiating ultraviolet rays is performed by positioning an ultraviolet emitter to face the target object on the spin chuck being rotated, the ultraviolet emitter having substantially the same width as the target object.

12. The pattern forming method according to claim 11, wherein the method further comprises performing a pre-cleaning process on the target object on the spin chuck in the cleaning section of the apparatus by supplying purified water onto the target object between the immersion light exposure and hydrophilic process.

13. The pattern forming method according to claim 12, wherein the method further comprises performing a post-cleaning process on the target object on the spin chuck in the cleaning section of the apparatus by supplying purified water onto the target object, and then spinning off the purified water and drying the target object by rotating the target object on the spin chuck in the cleaning section of the apparatus, both between said radiating ultraviolet rays and the heating process.

* * * * *